(12) United States Patent
Heyderman et al.

(10) Patent No.: US 8,085,578 B2
(45) Date of Patent: Dec. 27, 2011

(54) METHOD AND SYSTEM FOR CODING AND READ OUT OF INFORMATION IN A MICROSCOPIC CLUSTER COMPRISING COUPLED FUNCTIONAL ISLANDS

(75) Inventors: Laura J. Heyderman, Zofingen (CH); Thomas Jung, Zürich (CH); Elena Mengotti, Zürich (CH); André Bisig, Gross (CH); Arantxa Fraile Rodríguez, Zürich (CH); Frithjof Nolting, Zürich (CH); Hans-Benjamin Braun, Winterthur (CH); Thomas Schrefl, Herzogenburg (AT)

(73) Assignee: Paul Scherrer Institut, Villigen PSI (CH)

( * ) Notice: Subject to any disclaimer, the term of this patent is extended or adjusted under 35 U.S.C. 154(b) by 364 days.

(21) Appl. No.: 12/487,388

(22) Filed: Jun. 18, 2009

(65) Prior Publication Data
US 2010/0232251 A1 Sep. 16, 2010

Related U.S. Application Data

(63) Continuation-in-part of application No. 12/483,870, filed on Jun. 12, 2009, now abandoned.

(30) Foreign Application Priority Data

Mar. 13, 2009 (EP) .................................. 09003670

(51) Int. Cl.
G11C 11/00 (2006.01)
G11C 13/00 (2006.01)
(52) U.S. Cl. .......................... 365/151; 365/129; 365/244
(58) Field of Classification Search ................... 365/151
See application file for complete search history.

(56) References Cited

U.S. PATENT DOCUMENTS 5,613,140 A 3/1997 Taira
(Continued)

FOREIGN PATENT DOCUMENTS

EP 1489068 A1 12/2004
(Continued)

OTHER PUBLICATIONS

Xiao et al.: "Simulations of nanomagnet clusters with perpendicular uniaxial anisotropy for multilevel data storage", Journal of Applied Physics 99, 08G305 (2006), Department of Physics, University of Massachusetts, published online Apr. 20, 2006, 3 pages.

(Continued)

*Primary Examiner* — Son Mai
(74) *Attorney, Agent, or Firm* — Laurence A. Greenberg; Werner H. Stemer; Ralph E. Locher

(57) ABSTRACT

A method and a system for coding and reading out information in a microscopic cluster formed with coupled functional islands includes: generating the cluster by forming a regular microscopic pattern for locating the functional islands; making use of a physical or chemical property of each individual island and making use of the coupling between the functional islands; assigning different information to different energy levels of the cluster; effecting a change of the physical or chemical property of at least one functional island in order to change the energy level of the cluster to the energy level equivalent to the information content to be coded; and reading out the information. These measures allow forming a cluster having distinct energy levels, each being assigned to a distinct information content. These systems pave the way for future devices based on clusters of coupled islands and, armed with the complete knowledge of the energy states, the door is opened for use of these finite multistate clustered structures in future spintronic devices, for example for data storage, memory applications or to perform logic operations.

15 Claims, 12 Drawing Sheets

U.S. PATENT DOCUMENTS

| | | | |
|---|---|---|---|
| 6,118,686 A | 9/2000 | Taira et al. | |
| 6,156,273 A | 12/2000 | Regnier et al. | |
| 6,166,948 A | 12/2000 | Parkin et al. | |
| 6,392,914 B1 | 5/2002 | Kuroki et al. | |
| 6,627,748 B1 | 9/2003 | Ju et al. | |
| 6,867,429 B1 * | 3/2005 | Lutz | 257/40 |
| 6,985,276 B2 * | 1/2006 | Taguchi et al. | 359/280 |
| 6,988,058 B1 | 1/2006 | Sherwin et al. | |
| 7,488,819 B2 | 2/2009 | Manabe et al. | |
| 2003/0017364 A1 * | 1/2003 | Kikitsu et al. | 428/693 |
| 2004/0028598 A1 | 2/2004 | Harneit et al. | |
| 2004/0166673 A1 | 8/2004 | Hutchison et al. | |
| 2005/0037825 A1 | 2/2005 | Cordella et al. | |
| 2005/0128842 A1 | 6/2005 | Wei | |
| 2007/0258161 A1 | 11/2007 | Richter et al. | |

FOREIGN PATENT DOCUMENTS

| | | |
|---|---|---|
| EP | 1855273 A2 | 11/2007 |
| JP | 2006080257 A | 3/2006 |
| WO | 0241247 A1 | 5/2002 |
| WO | 2004008132 A1 | 1/2004 |

OTHER PUBLICATIONS

Xiao et al.: "Clusters of interacting single domain Co nanomagnets for multistate perpendicular magnetic media applications", Journal of Applied Physics 103, 07C521 (2008), Department of Physics, University of Massachusetts, published online Mar. 21, 2008, 3 pages.

* cited by examiner

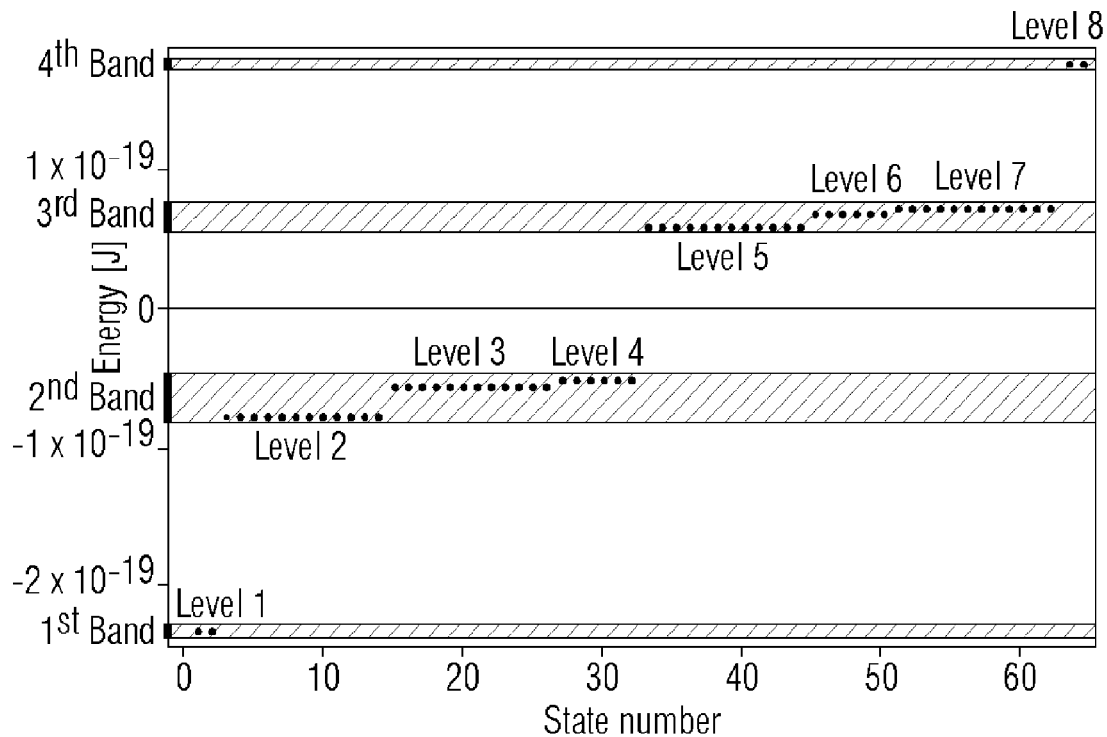

FIG. 4B

| Level 1<br>6-0/6-0<br>E=−2.14 × 10⁻¹⁸ J<br>2 fold degeneracy | Level 4<br>6-0/4-2<br>E=−1.64 × 10⁻¹⁸ J<br>8 fold degeneracy | Level 7<br>6-0/5-1<br>E=−1.332 × 10⁻¹⁸ J<br>8 fold degeneracy | Level 10<br>6-0/2-1-2-1<br>E=−1.30 × 10⁻¹⁸ J<br>4 fold degeneracy |
|---|---|---|---|
| Level 2<br>6-0/5-1<br>E=−2.13 × 10⁻¹⁸ J<br>4 fold degeneracy | Level 5<br>6-0/4-2<br>E=−1.570 × 10⁻¹⁸ J<br>8 fold degeneracy | Level 8<br>6-0/3-1-1-1<br>E=−1.329 × 10⁻¹⁸ J<br>8 fold degeneracy | Level 11<br>6-0/3-1-1-1<br>E=−1.26 × 10⁻¹⁸ J<br>4 fold degeneracy |
| Level 3<br>6-0/5-1<br>E=−1.65 × 10⁻¹⁸ J<br>8 fold degeneracy | Level 6<br>6-0/3-3<br>E=−1.567 × 10⁻¹⁸ J<br>8 fold degeneracy | Level 9<br>6-0/5-1<br>E=−1.31 × 10⁻¹⁸ J<br>4 fold degeneracy | Level 12<br>5-1/5-1<br>E=−1.25 × 10⁻¹⁸ J<br>4 fold degeneracy |

| N | Ground state | Number of states | Number of energy levels |
|---|---|---|---|
| 2 |  2 | 4 | 2 |
| 3 |  6 | 8 | 2 |
| 4 |  2 | 16 | 5 |
| 5 |  4 | 32 | 9 |
| 6 |  2 | 64 | 9 |
| 7 |  4 | 128 | 13 |
FIG. 8

METHOD AND SYSTEM FOR CODING AND READ OUT OF INFORMATION IN A MICROSCOPIC CLUSTER COMPRISING COUPLED FUNCTIONAL ISLANDS

CROSS-REFERENCE TO RELATED APPLICATION

This is a continuation-in-part of application Ser. No. 12/483,870, filed Jun. 12, 2009; the application also claims the priority, under 35 U.S.C. §119, of European patent application No. 09 003 670.8, filed Mar. 13, 2009; the prior applications are herewith incorporated by reference in their entirety.

BACKGROUND OF THE INVENTION

Field of the Invention

The present invention relates to a method and a system for coding and reading out information in a microscopic cluster comprising coupled functional islands.

With the ongoing demand on improvements related to the storage density of memory, new ways are required to both extend the current physical limitations and to improve the cost-benefit ratio of such elaborated solutions. The efforts spent into these investigations can be for example illustrated by the disclosure of the European published patent application EP 1 855 273 A2, Japanese published patent application JP 2006080257-A and U.S. Pat. No. 6,166,948 wherein the latter particularly describes magnetic memory arrays with magnetic tunnel junction memory cells having flux-closed free layers. Two anti-parallel layers, one on top of the other, are dipolar coupled to minimize inter island dipolar coupling and dipolar coupling with pinned layer so that the MRAM array can be made smaller.

U.S. patent application publication US 2005/128842 A1 discloses annular nano-structures which support a bistable magnetic flux closure state which can be switched depending on the direction of current through the wire around which they are assembled. European application EP 1 489 068 A1 shows a multidentate ligand structure of multi-nucleus metal complex chains in order to provide arithmetic and logic units. Other sources in the field of bio-chemistry (U.S. Pat. No. 6,627,748 B1, US 2004166673 A1) provide combinatorial fluorescence energy transfer tags and their applications for multiplex genetic analyses wherein fluorescent molecules comprise energy transfer donors and acceptors linked through a molecular scaffold to produce a unique fluorescence emission signature, e.g. for multi-component gene analysis.

Further, many investigations are focusing on the field of quantum devices (U.S. Pat. No. 5,613,140; U.S. Pat. No. 6,118,686; U.S. Pat. No. 6,392,914; U.S. Pat. No. 6,988,058; WO 02/041247 A1; WO 2004/08132 A2) which use the orientation of the electron spin in elaborate structures, such as fullerenes, to code information, for example by regulating the resonant frequency to control the electron transfer to and from the fullerene cage with adjustable residence time. Unfortunately, quantum computing is currently in its infancy and far beyond commercial realization.

SUMMARY OF THE INVENTION

Therefore, it is the aim of the present invention to provide a different way to store and code information content which will envision commercial realizations at stage much earlier than quantum devices or other of the prior art devices discussed above.

This invention has applications in data storage such as patterned media, memory e.g. non-volatile or flash, logic devices, electronic devices e.g. spintronics, tagging for e.g. biotechnology and security, read only memories, write once-read many times memories, quantum devices and computers, holographic recording, microwave oscillators, quantum systems (including quantum devices and quantum computers) or any other application involving handling of information.

With respect to a method, this aim is achieved according to the present invention by a method for coding and read out of information in a microscopic cluster comprising coupled functional islands, comprising the steps of:

a) generating the cluster by forming a regular microscopic pattern for locating the functional islands, b) making use of a physical and/or chemical property of each individual island and making use of the coupling between the functional islands in order to define a plurality of energy levels in each cluster and/or among neighboring clusters c) assigning different information to different energy levels of the cluster; and d) effecting a change of the physical and/or chemical property, e.g. a change in the state or phase, of at least one functional island in order to change the energy level of the cluster to the energy level equivalent to the information to be coded;

e) read out of the information.

With respect to a system, this aim is achieved according to the present invention by a microscopic system for coding and read out of information in a microscopic cluster comprising coupled functional islands, comprising:

a) at least one cluster being formed as a regular microscopic pattern for locating the functional islands, wherein different information is assigned to different energy levels of the cluster and/or neighboring clusters;

b) each individual island having a physical and/or chemical property and having a specific coupling to its neighbors within the cluster;

c) a means for effecting a change of the physical and/or chemical property, e.g. a change in the state or phase, of at least one functional island in order to change the energy level of the cluster to the energy level equivalent to the information content to be coded; and d) a means for read out of the information.

These measures allow the formation of a cluster having distinct energy levels, each being assigned to a distinct information content. These systems pave the way for future devices based on clusters of coupled islands and, armed with the complete knowledge of the energy states, the door is opened for use of these finite multistate clusters in future spintronic devices, for example for data storage, memory devices or to perform logic operations. The island could comprise a small material volume, a nanoparticle or nanocrystal, a molecule e.g. fullerene, atom, or sub-atomic species (e.g. electrons), and can comprise a single or many materials/species. The size of the island is not limited.

With respect to suitable embodiments of the present invention, the physical and/or chemical property, static or dynamical, and the corresponding coupling can be at least one selected from a group or groups containing:

magnetic dipole orientation within the islands with a magnetic dipolar coupling between the islands;

electric dipole orientation within the islands with an electric dipolar coupling between the islands;

the dimensions, elastic response, hardness, magnetization, electric polarization or optical properties of deformable islands, with e.g an elastic material or springs with tunable spring constants providing a mechanical coupling;

island (e.g. molecular) orientation with the coupling via physical or chemical interaction through a linker species, substrate or other medium;

island (e.g. molecular) charge or spin orientation with coupling via exchange interaction, dipolar interaction, spin or charge transfer;

chemical binding status with coupling via linker molecules, substrate or other medium;

light absorption, reflection or polarisation characteristics, with a coupling via e.g. plasmonic, photonic e.g. fluorescence resonance energy transfer, or thermal interactions through the supporting surface or matrix;

electrical, electronic or spintronic properties (e.g. spin, charge, current flow, conductance/resistance, electrical potential/voltage, capacitance, induction, memristance, current/voltage characteristics) in a device (e.g. active, passive, oxide, molecular device) with coupling via electrical or electronic means (e.g. electric fields, electrostatic fields, current through an interconnect, electric charge transfer, orbital or quantum coupling);

resonant frequency of engineered resonators and oscillators coupled by various means e.g. electromagnetic fields;

resonant frequency of a microscopic system containing islands (e.g. precessing spins, magnetic moments or vibrating molecules), coupled by various means (e.g. electromagnetic fields).

This invention includes, but is not limited to the above island properties and coupling. In particular, a combination of the above physical and/or chemical properties, capable of being coupled by other physical and/or chemical interactions could be foreseen. The coupling depends very much on the actual interaction chosen and on the coupling media. For example, multiferroic islands would have both electric dipoles and magnetic dipoles, which can be coupled, and interact with neighboring islands via either or both electric or/and magnetic dipolar coupling. In another example, ferroelectric islands would have electric dipoles which can be coupled, and interact with neighboring islands via either or/and both electric dipolar or mechanical coupling. In another example, magnetic molecules can either couple via the magnetic dipolar field or by the exchange interaction mediated through a chemical bond.

This invention relates to static or dynamic properties, which may be frequency dependent.

In order to master the complexity of the energy levels and to guarantee a clear concept on the coupling mechanism among the different functional islands, each functional island shall be engaged in one of at least two possible states with respect to the physical or chemical property. For simplification, the number of just two possible states is detailed here.

The success of mastering the different energy levels of each cluster also depends on whether a suitable cluster structure is provided which satisfies the demand on clearly distinguishable energy levels within each cluster. The arrangement of the islands is critical and therefore, preferred embodiments of the present invention include clusters arranged on a specific lattice, whether two or three dimensional. These lattices can be triangular or rectangular in their basic form, including superstructures made up of these forms, and each vertex or interconnect of the respective forms can be represented by a functional island. For specific geometry and specific interactions, frustration, where not all interactions are energetically favorable, can be introduced which leads to a modification of the energy landscape.

Typically, the different energy levels are determined by the number and/or location of islands with specific states in a given cluster. Note that the energy levels could also be modified by specifically chosen cluster-cluster interactions.

For vector properties of the islands such as magnetic dipoles, typically, the different energy levels are determined by the number and/or the location of the head-to-tail coupling of neighboring functional islands and/or the number and/or the location of the head-to-head or tail-to-tail coupling of neighboring functional islands within the same cluster and/or in the bridging/common edges of neighboring clusters.

With reference to the possible coupling mechanism mentioned above, the change of the energy level is effected by at least one of:

a) island-related or cluster-related application of magnetic field;

b) island-related or cluster-related application of electric field;

c) island-related or cluster-related application of electromagnetic field;

d) island-related or cluster-related application of electric current;

e) island-related or cluster-related application of pressure, stress or strain;

f) island-related or cluster-related application of heat or light; and g) island-related or cluster-related application of electromagnetic radiation or chemically reactive agents.

Once more in summary, with the ongoing demand on improvements related to the storage density of memory, new ways are required to both extend the current physical limitations and to improve the cost-benefit ratio of such elaborated solutions. The primary object of the present invention is to provide a method for storage and read-out of information which will see commercial realizations and implementation at stage much earlier than quantum devices or other recent advances.

Other features which are considered as characteristic for the invention are set forth in the appended claims.

Although the invention is illustrated and described herein as embodied in a method and system for coding and read out of information in a microscopic cluster comprising coupled functional islands, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 3 the energy characterization of the one-ring kagome structure;

FIG. 8 geometries of the different clusters of islands with perpendicular anisotropy on a triangular lattice with the number of islands, N=2 to 7;

DETAILED DESCRIPTION OF THE INVENTION

Figure 1:
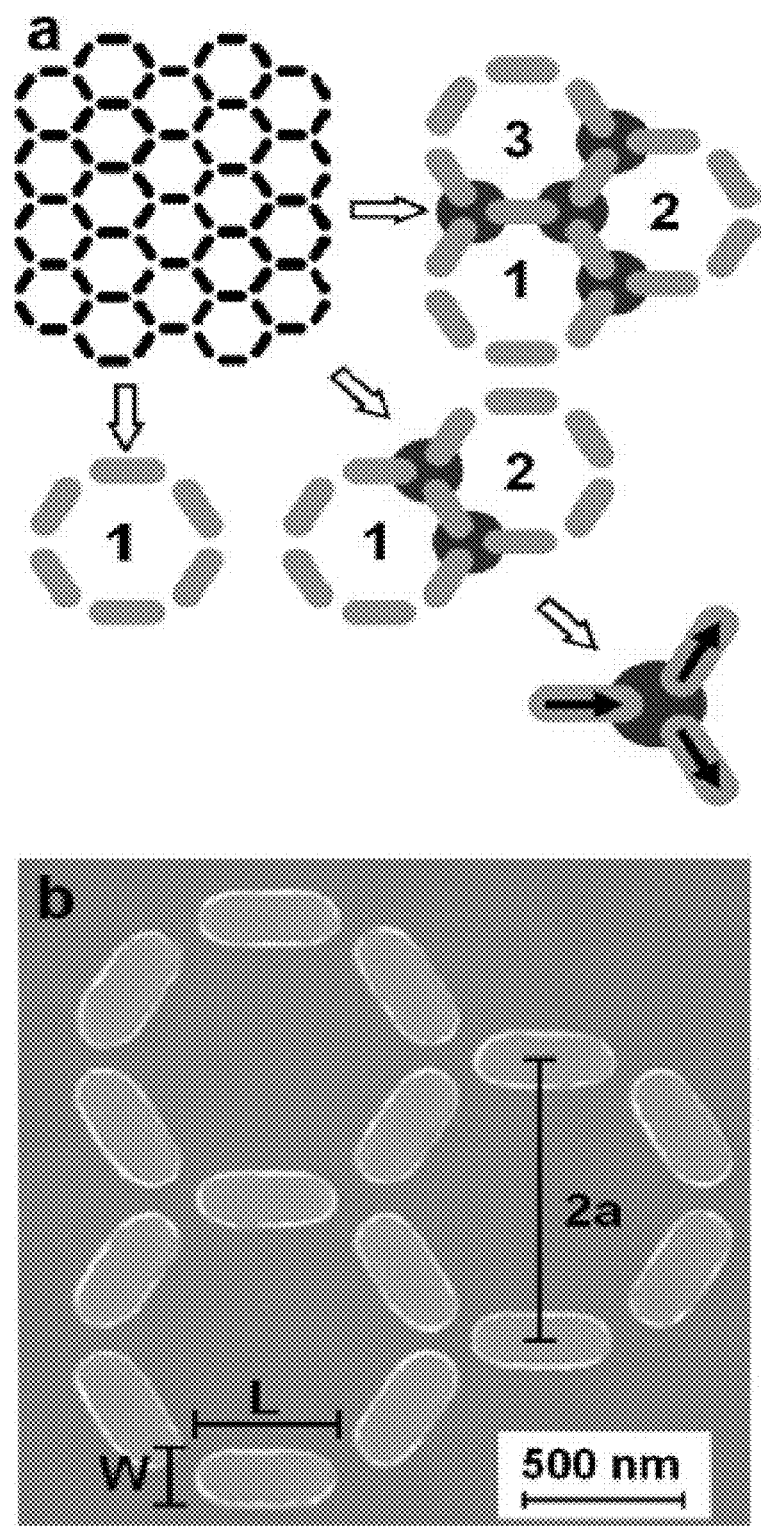
FIG. 1 a schematic sketch of the artificial kagome spin ice building blocks.

In the following, attention is focused on the kagome spin ice, where the elongated ferromagnetic islands are placed on the sites of a kagome lattice, so forming the links of a honeycomb (see FIG. 1*a*). The basic artificial kagome spin ice building blocks consisting of one, two and three rings, are extracted from the infinite array. The three-island frustrated vertices are highlighted with dark grey discs and an example of one of the one-in/two-out spin ice moment configurations is given in part a). Part b) shows a SEM image of a three-ring kagome structure fabricated from a 20 nm-thick permalloy islands with W=200 nm, L=470 nm, a=500 nm.

The kagome system has the advantage over the square-lattice spin ice that the interactions between the three islands at a vertex are equivalent. The so-called ice rule dictates that either two moments point towards and one points away from the vertex (two-in/one-out), or vice-versa (one-in/two-out). This results in six possible configurations, one of which is shown in FIG. 1*a*, where compensation of the local stray fields is not possible. By focusing on the building blocks, extracting the one-, two- and three-ring structures from the infinite kagome system as shown in FIG. 1*a*, the energies of all of the possible states using a dipolar interaction model can be determined.

Figure 2:
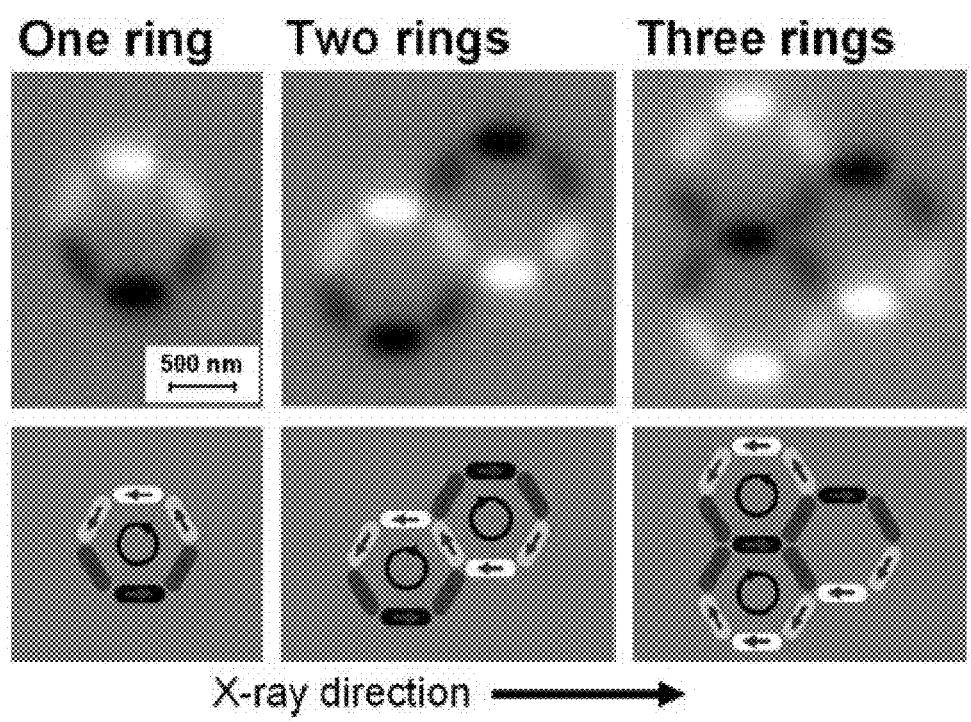
FIG. 2 XMCD images of the ground states of the artificial kagome spin ice building blocks.

Here each island is represented with a single magnetic moment, made possible by the fact that the monodomain islands have a finite size and are isolated, in contrast to a kagome network where domain walls are present. Employing x-ray magnetic circular dichroism (XMCD) in a photoemission electron microscope (PEEM), one is able to directly observe the magnetic configuration in each individual island and to confirm that they are single domain as depicted in FIG. 2. FIG. 2 shows XMCD images of the ground states of the artificial kagome spin ice building blocks. The single contrast associated with each island indicates that they are monodomain with the magnetic moment aligned parallel to the island long axis. The x-ray propagation direction is indicated (horizontal). Islands with moments parallel (antiparallel) to the x-ray direction, i.e. pointing to the right (left), have a black (white) contrast. Islands with moments at ±60° or ±120° to the x-ray polarization direction have one of two intermediate contrasts: dark grey or light grey, respectively. The four contrast levels in a single XMCD image allow the unequivocal determination of the magnetic states given schematically below each image.

In order to fabricate ferromagnetic islands arranged on a kagome lattice (FIG. 1*b*), the pattern was first exposed in an 80 nm-thick layer of polymethylmethacrylate (PMMA) resist spin-coated on a silicon (100) substrate using an electron beam writer. Ferromagnetic cobalt and permalloy (Ni80% Fe20%) thin films, with a 1 nm-thick aluminium capping layer to prevent oxidation, were then deposited on the patterned resist by dc magnetron sputtering. Ultrasound assisted lift-off in acetone was then employed to remove the remaining resist together with the unwanted magnetic material. The ring structures were studied with the following three island types (W=width and L=length as shown in FIG. 1*b*):

Type I: cobalt islands, W=160 nm, L=470 nm, thickness=10 nm

Type II: cobalt islands, W=200 nm, L=470 nm, thickness=10 nm

Type III: permalloy islands, W=200 nm, L=470 nm, thickness=20 nm

Magnetic images were obtained with a PEEM at the SIM beamline of the Swiss Light Source, Paul Scherrer Institute, employing the XMCD effect at the Fe or Co $L_3$-Edge. The intensity is a measure of the angle between the x-ray circular polarization vector and the magnetic moments. Ferromagnetic domains with magnetic moments parallel or antiparallel to the x-ray polarization vector appear black or white in the XMCD image, and domains with magnetic moments at an intermediate angle have an intermediate grey contrast.

To demagnetize the samples, a magnetic field was applied while the sample rotates about an in-plane axis at a frequency of ≈2 Hz. The field was then decreased slowly, at ≈5 mT/sec, from a field value of 850 mT, well above the saturation field of the kagome structures, down to zero. For each demagnetization run, 100 identical one-ring structures, 64 two-ring and 64 three-ring structures were measured which were placed on the same substrate with sufficient separation between the neighboring structures (3.5 μm for the arrays of one-ring structures and 4.5 μm for the two- and three-ring structures) so that the stray field interaction between each structure is negligible. To determine the effect of the demagnetization geometry, demagnetization runs were also performed with an out-of-plane rotation axis. The two geometries for the demagnetization are given in FIG. 7*a*.

Turning to the energy calculations of the different possible states, sets the groundwork for interpreting the experimental observations. The elongated ferromagnetic islands investigated here are single domain (see FIG. 2) and can therefore be approximated by a single macroscopic spin. The dipolar energy between two islands is then given by:

$$E(\vec{r}_1, \vec{r}_2, \vec{m}_1, \vec{m}_2) = \frac{1}{\|\vec{r}\|^2}\left[\vec{m}_1 \cdot \vec{m}_2 - \frac{3}{\|\vec{r}\|^2}(\vec{m}_1 \cdot \vec{r})(\vec{m}_2 \cdot \vec{r})\right] \quad (1)$$

where $\vec{m}_1$ and $\vec{m}_2$ are the magnetic moments of two interacting islands and $\vec{r}$ is the distance vector between the centres of the islands. The moment of each island in our experiment is of the order of $1\times10^8$ Bohr magnetons. This gives an interaction energy between nearest neighbors of $10^{-19}$ J (equivalent to $5.4\times10^4$ K) for a lattice parameter a=500 nm, corresponding to a high coupling strength in the experiment (see island geometry in FIG. 1*b*). Taking into account the shape anisotropy, the moment is set in one of two directions parallel to the long axis of the island. For each of the $2^N$ possible configurations, where N is the number of islands in the structure, the energy value, which corresponds to the sum of all terms divided by N, is calculated and plotted in FIGS. 3, 4 and 5. The states with the same energy are grouped together and ordered with increasing energy from left to right.

For the one-ring kagome structure, six islands are present resulting in $2^6=64$ possible states and the energy levels are grouped in four bands (FIG. 3a). Each pair of neighboring islands is oriented at 120° to each other and the minimum (maximum) dipolar energy occurs when neighboring moments are aligned head-to-tail (head-to-head or tail-to-tail). Therefore the ground state of a single ring consists of moments circulating either clockwise or anticlockwise. Reference is made to this energy state as the vortex state due to the similarity with equivalent states in ferromagnetic discs and rings.

With its two-fold degeneracy, the vortex state corresponds to the lowest energy level of the energy plot, labeled level 1, which is simply the first band. Here the neighbor, the next-nearest-neighbor and the next-next-nearest neighbor interactions are all satisfied. The levels 1 to 8 are labeled in order of increasing energy and the terminology of the (n–m) state is introduced, where n refers to the highest number of neighboring magnetic moments pointing in the same direction around the structure, and m is the number of neighboring magnetic moments pointing in the opposite direction. For each energy level, a characteristic configuration together with the energy value and the degree of degeneracy is given in FIG. 3b. For the single ring n+m=6, and the vortex state is simply the 6-0 state. In the next highest band, which is split into three levels (2, 3 and 4), there are 30 possible configurations. The states in this energy band are characterized by having two of the six vertices not in the head-to-tail configuration. Indeed one vertex is in the head-to-head and one is in the tail-to-tail configuration. These levels contain the 5-1, 4-2 and 3-3 states as shown in FIG. 3b. The 3-3 state is referred to as the 'onion state', which is equivalent to the state found in ferromagnetic rings with two domain walls. The next highest band, including levels 5 to 7, contains states with two head-to-head vertices and two tail-to-tail vertices. In the highest band (level 8), all vertices have the unfavorable head-to-head or tail-to-tail configuration.

Figure 4A:
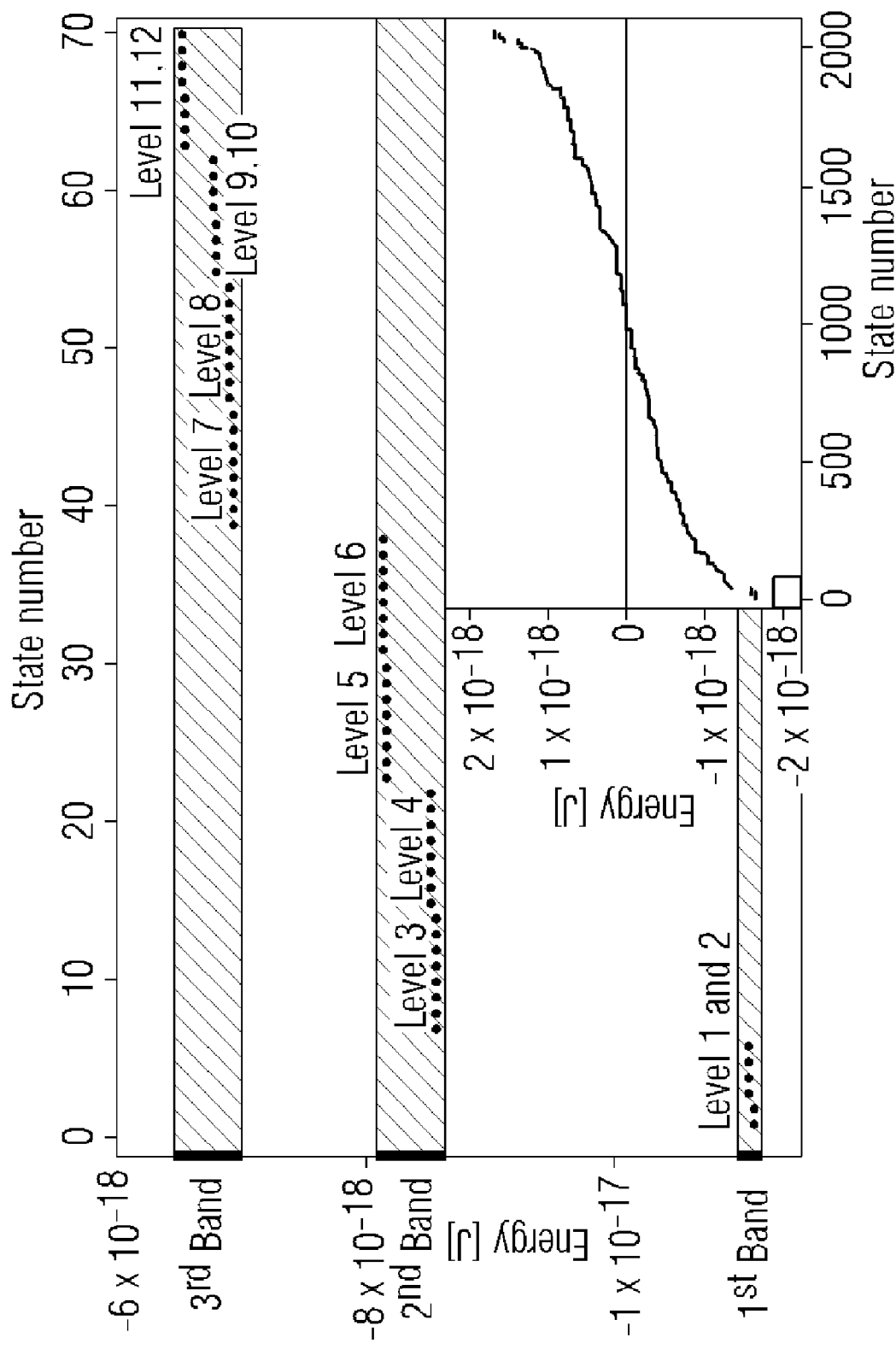
FIG. 4 the energy characterization of the two-ring kagome structure.

For the two-ring kagome structure, many more states are present ($2^{11}=2048$) (FIG. 4a). Here, 56.25% of the total number of states (corresponding to 1152 configurations) obeys the ice rule at both vertices. The energies of all of the 2048 possible states, shown in detail for the lowest 70 energy states, are shown in FIG. 4a. The ground state with a two-fold degeneracy consists of two vortices (6-0/6-0) with opposite chirality, which is referred to as the double-vortex state. This constitutes level 1 and is shown with the islands in FIG. 4b. The 'external-flux-closure' state (6-0/5-1) at level 2 in FIG. 4b is very close in energy to the ground state. Here the outer magnetic moments form a chain of moments circulating either clockwise or anticlockwise around the whole two-ring structure, and the central island moment falls into one of the two possible directions resulting in a four-fold degeneracy. Level 1 and level 2 both belong to the lowest energy band shown in FIG. 4a. From these two basic configurations, the next highest energy states can be derived simply by flipping moments in the individual islands, as indicated by the outlined islands in FIG. 4b.

Figure 5:
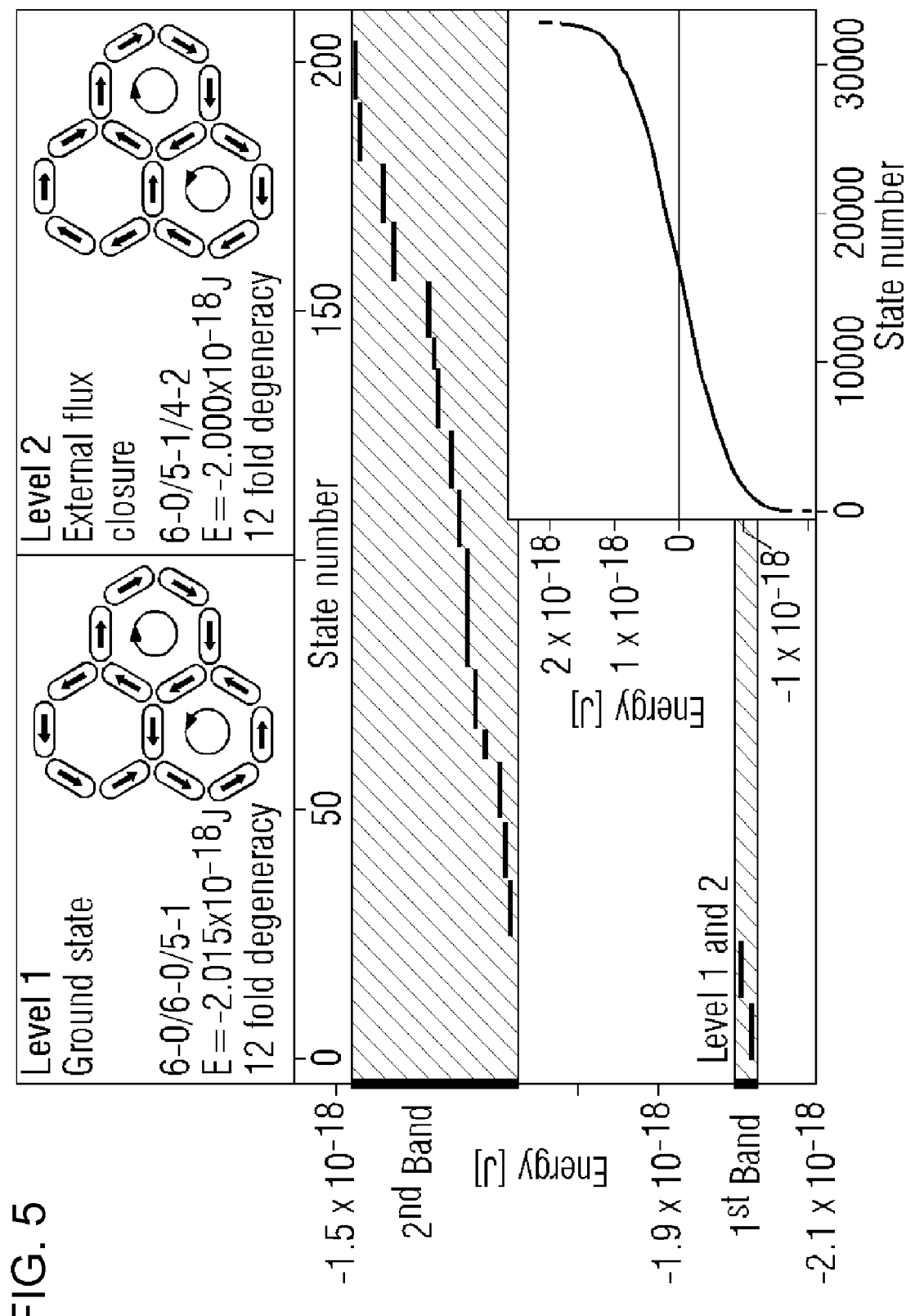
FIG. 5 the energy characterization of the three-ring kagome structure.

For the three-ring kagome structure, while two vortices are allowed, it is no longer possible to have three complete vortices. Here only ~32% of the total $2^{15}=32768$ states (corresponding to 10368 states) have all four three-island vertices (highlighted with grey discs in FIG. 1a) in a spin ice configuration. The energies of all of the possible configurations, shown in detail for the lowest 204 energy states, are shown in FIG. 5. The lowest energy band consists of two discrete levels. Level 1 corresponds to the ground state which consists of two vortices with opposite chirality and a 5-1 state for the third ring, and level 2 is the external flux closure state with the outer magnetic moments forming a chain of moments circulating either clockwise or anticlockwise around the whole three-ring structure and the three moments in the middle of the structure following the ice rule. In FIG. 5, these states are have outlined and not-outlined islands, respectively. Both of these states have a twelve-fold degeneracy. The next highest energy states contain either two or one vortex.

Turning to the experimental observations of the moment configurations in arrays of kagome ring structures prepared by electron-beam lithography. The observations are performed employing XMCD in a PEEM. This gives a high magnetic contrast with four distinct grey levels associated with a kagome structure, allowing the unambiguous determination of the direction of the moments in all islands with a single image (FIG. 2). The uniform contrast measured in every island confirms that they are single domain and allows us to use a single dipole approximation to calculate the energy of a given state. The distribution of states in arrays of kagome structures is measured with three different island types (I, II and III) having different materials and dimensions (see experimental methods section). First, the frequency of observed states versus the coupling strength, $m^2/a^3$, was measured after the samples were demagnetized with rotation of the sample about an in-plane axis as described in the experimental methods section.

Figure 6:
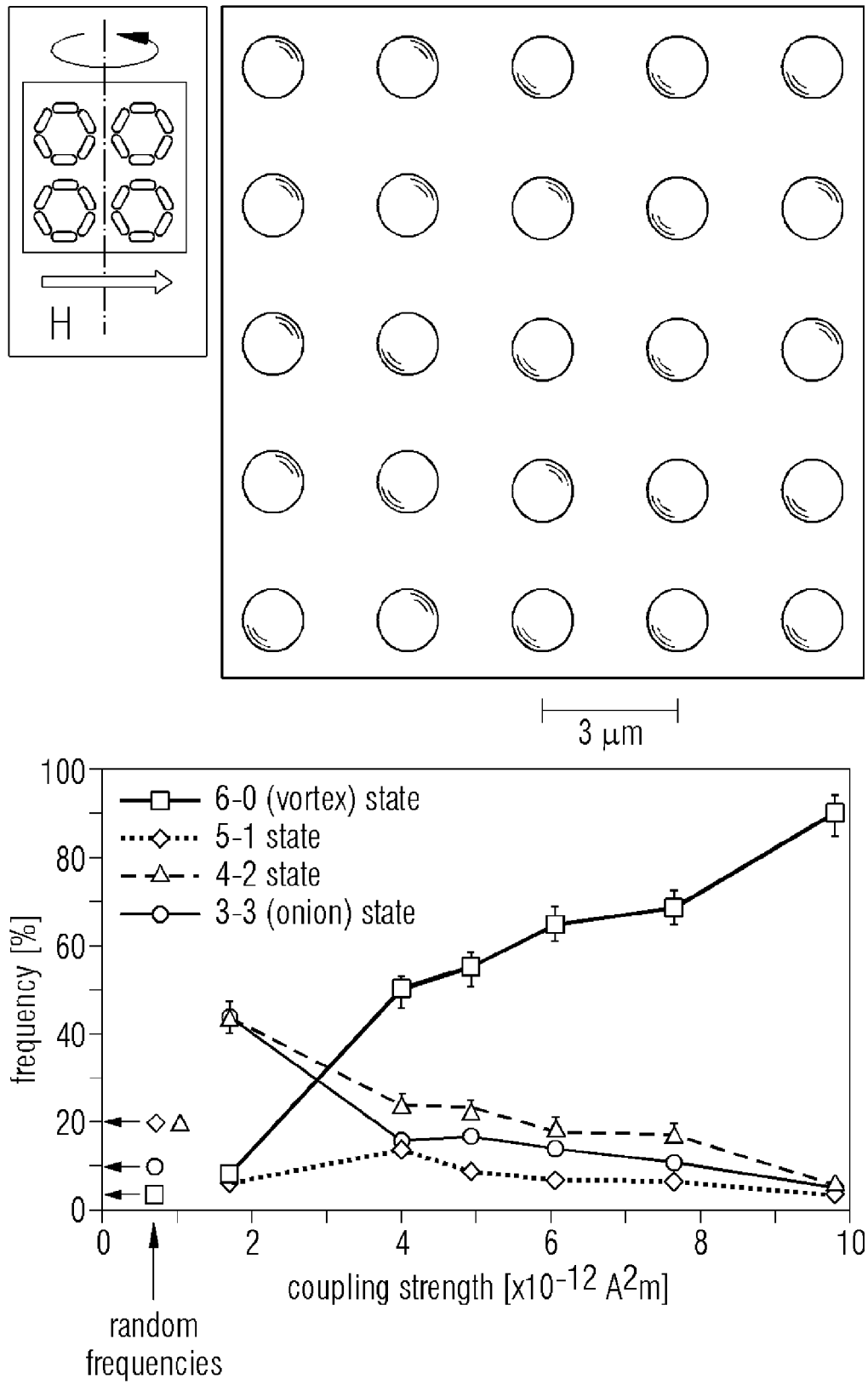
FIG. 6 the experimental frequency of states in the one-ring kagome structure following demagnetization.

For the one-ring kagome structures, practically only the states belonging to the lowest two energy bands (levels 1 to 4 in FIG. 3a) were observed following demagnetization and a representative analysis of these states (island type I), including an XMCD image of part of the sample, is given in FIG. 6. For high dipolar coupling strength (low lattice parameter, a), most of the one-ring structures fall into the vortex ground state, which not only has the lowest energy but also has a zero total magnetization. As the dipolar coupling strength is decreased towards zero, i.e. as a is increased to a high value, one would expect the frequency of a given configuration to reflect the random probability of the moment configurations. This is simply given by the degree of degeneracy of each state divided by the total number of states, and indicated in FIG. 6 with arrows. There is a tendency of the number of ground and 5-1 states to approach the random frequency as the coupling decreases. However, the 3-3 and 4-2 states increase to a value significantly higher than the random expectation. Here the applied field direction governs the behavior at low coupling strengths, favouring states with the moments aligned parallel to the applied field (where the majority of islands appear bright or dark in the XMCD image depending on the last field direction before the moments freeze in). One indeed only observes two of the six possible onion states and four of the twelve 4-2 states.

For the two- and three-ring structures, because of the vast number of available configurations, a full analysis of all the states present is not presented here. Here it is more informative to compare the frequencies of low energy states at high coupling strengths for the different numbers of rings. One measured a sample with kagome structures with type II islands and a high coupling strength corresponding to $m^2/a^3=7.4\times10^{-12}$ $A^2m$, following demagnetization with rotation of the sample about an in-plane axis (see FIG. 7a-c). For the one-ring kagome structures, 94±2% fall into the vortex state corresponding to the lowest energy band. For the two-ring structures, the percentage of states in the first energy band (including the double-vortex and flux closure states) is 48±8%. For the three-ring structure the percentage of states in the lowest energy band (ground state with two vortices and external flux closure state) is 31±6%.

Since the ability to achieve the ground state with our demagnetization method reduces significantly as a function of the number of rings, it is likely that as the number of rings is increased to an infinite value the ground state will never be achieved using this demagnetization method. At low coupling (a=820 nm), the percentage of the low energy states for the two- and three-rings was negligible (<0.6%), thus tending to the random values but again with a directionality of the magnetic configurations (preponderance of bright or dark XMCD contrast) given by the applied field direction when the moments freeze in. The kagome spin ice rule at the three-island vertices is practically always preserved, notably even at low coupling strengths, with the number of three-island vertices which do not follow the ice rule (two-in/one-out or vice-versa) on average for both two- and three-rings less than 0.2% (i.e. 1 out of the 584 vertices observed).

The frequency of states for demagnetized samples have been determined with all of the different island types, and found that the general behavior was the same. In addition, the same sample was demagnetized four times (with island types I and II), to verify that the distribution of states did not significantly change, and it was found that each structure did not necessarily fall into the same magnetic state during each demagnetization run.

During the demagnetization process the moments in the ring structures essentially switch back and forth, i.e. between two opposite onion states, when the applied field is above the switching field. In order to observe if this switching occurs via states in the lowest energy band, one directly examined the magnetization reversal in an applied field in-situ in the PEEM. The orientation of the applied field is equivalent to that used in the demagnetization with an in-plane sample rotation axis and a schematic of the applied magnetic field geometry for in-situ switching is given in FIG. 7a. Following saturation of the magnetization, XMCD snapshots of the switching process on applying a reverse field were recorded, increasing its value from zero in steps of approximately 6 Oe, and recording images at remanence after reducing the field between each step back to zero. For this, islands with a lower coercivity were chosen (island type III with a=540 nm) ensuring that they switch in the PEEM magnetizing holder. A full hysteresis loop was followed, applying the field in both directions, and measurements were performed on 50 one-ring structures, 32 two-ring, and 32 three-ring structures.

It was observed that 88% of the one ring structures switch via the vortex state, with 26% of the one-ring structures switching directly via the vortex state without passing through any other state. For the two-ring structure, the percentage that switch via an energy state in the lowest energy band (double-vortex or external flux closure) corresponds to 48%, although the simple path double-onion state to low energy state to reverse-double-onion state is never followed and always includes a few other states. For the three-ring structure the observed frequency passing through a state belonging to the lowest energy band, i.e. the ground or external flux closure state, was 14%.

Figure 7:
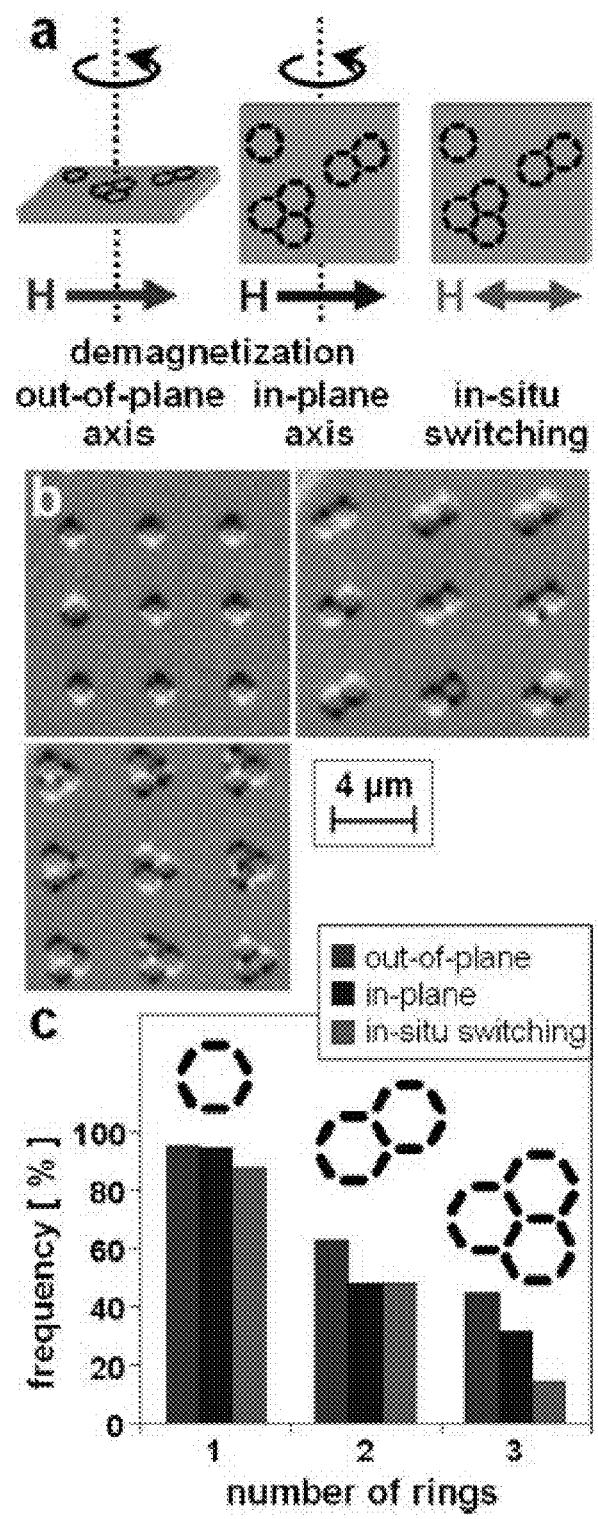
FIG. 7 the experimental frequency of low-energy states (band 1) for strongly coupled islands with increasing number of rings.

Notably, the decrease in frequency of observed low energy states for increasing number of rings in the kagome building blocks during magnetization reversal is comparable to the decrease in frequency of low energy states observed following demagnetization with an in-plane sample rotation axis (see FIG. 7c). This implies that the magnetization reversal forms the basis of the demagnetization process. The oscillation of the applied field with decreasing amplitude during the demagnetization process simply allows us to collect all of the low energy states which occur at different field values during switching.

Finally, the question of whether the geometry of the demagnetization procedure will affect the frequency of states was addressed, specifically if rotation about an out-of-plane axis in the applied magnetic field will increase the ability to achieve the ground state. It turns out that the results do not significantly differ from those found with an in-plane rotation axis, namely, on increasing the number of rings there is a significant decrease in the number of ground states (see FIG. 7c). At low coupling, again a directionality in the configurations is introduced given by the applied field direction before the moments freeze in, with a high proportion of onion and 4-2 states in the single ring structure. For example, in one run with type II islands and a coupling of $1.7 \times 10^{-12}$ $A^2m$, more than 60% of the structures were in the onion or 4-2 state which is significantly higher than the random expected value of 28% and, as before, only two of the six possible onion states and four of the twelve 4-2 states were observed.

By focusing on the building blocks of an artificial kagome spin ice, one has been able to fully characterize the possible energy states employing dipolar calculations and, in particular, one was able to identify the lowest energy states. For the single ring, a high percentage fall into the vortex state demonstrating the high efficiency of the demagnetization procedure. It was found that as the number of rings increases there is a dramatic decrease in the ability to achieve the low energy states, a behavior also identified in the magnetization reversal. Here the system gets trapped in one of the large number of available states and at low interisland dipolar coupling strengths, the orientation of the applied field strongly influences the resulting configurations. Extrapolating these results, one draws the important conclusion that achieving the ground state will be practically impossible in an infinite system using a demagnetization method involving rotation of the sample in a magnetic field. Indeed, in contrast to the spin ice system where the ground state is made up of a series of local vortices, only a maximum of two neighboring vortices are possible, so that only larger flux closure loops will emerge.

Similar efforts have been undertaken to investigate the dipolar energy states in clusters of magnetic nanoislands with perpendicular anisotropy. Different cluster arrangements of perpendicular nanoislands were explored on a triangular lattice. The energies of all of the possible states were again determined using a dipolar calculation. Employing photoemission electron microscopy (PEEM), one directly observed the magnetic states in arrays of island clusters following demagnetization with an ac magnetic field. It was found that there is an increase in the frequency of low energy states as the coupling strength increases. Due to its simplicity and the easy accessibility of the various states, the three-island cluster shows the most promise for future data storage.

Focus was placed on the study of compact clusters consisting of two to seven islands, choosing island arrangements on a triangular lattice which minimize the total area covered by the island cluster (see FIG. 8). The dipolar energy for all of the $2^N$ possible configurations for each cluster were calculated, where N is the number of islands. For the energy plots, the states with the same energy are grouped together in levels and ordered with increasing energy from left to right. In general, for each cluster an increase in dipolar energy is associated with an increase in the number of unfavorable island-island interactions and/or an increase in the total magnetization $(M_\uparrow - M_\downarrow)$.

From the energy calculations, the lowest energy ground state configurations can be determined and are given in FIG. 8 together with their degree of degeneracy. In addition, the number of possible states ($2^N$) and the number of energy levels are indicated. The magnetic moment of each island can point either up or down (white or black corresponding to moments pointing out of or into the surface plane) and for neighboring islands it is energetically favorable to have one island with the moment pointing up and one island with the moment pointing down. This up-down configuration is indeed the ground state for the two-island cluster, which has a two-fold degeneracy. On increasing the number of islands, frustration is introduced and is immediately apparent in the ground state of the basic three-island cluster in FIG. 8, where one island-island interaction is always unfavorable with parallel island moments indicated by the continuous line. The other two interactions have favorable up-down (white-black) island interactions, indicated by a dashed line between the islands. In order to describe this moment configuration, the expression is introduced that the three neighboring islands 'obey the three-island rule' (i.e. with a one-up/two-down moment configuration or vice versa).

For the four-island cluster, the ground state consists of two three-island subclusters obeying the three-island rule, which are combined in such a way that the unfavorable interaction (given by the continuous line) is shared by the subclusters. In the five-island cluster, the ground state consists of the four-island cluster ground state with one additional island leading to a pair of unfavorable interactions parallel to each other. The ground state of seven-island cluster also contains several three island subclusters which all obey the three-island rule, and the unfavorable interactions are shared between the subclusters. All of the clusters described so far are made up of three-island clusters obeying the three-island rule and have the same ground state configurations predicted for a finite triangular Ising antiferromagnet. However, for the six-island cluster, there is one central three-island subcluster (three central black dots in FIG. 8) which does not obey the three-island rule and deviates from the ground state configuration predicted for the triangular Ising antiferromagnet, which involves nearest neighbor exchange rather than long range dipolar interactions.

Figure 9:
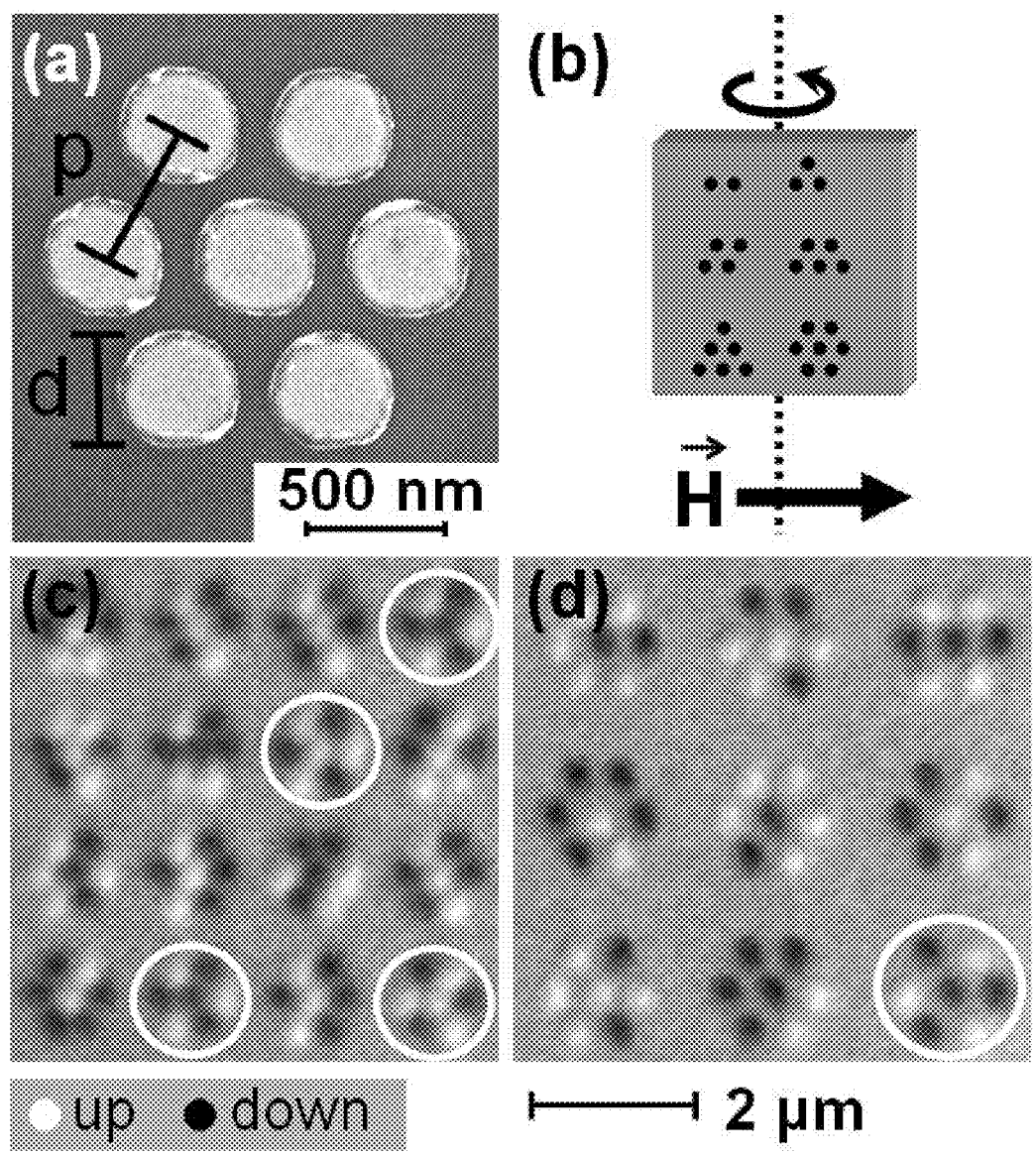
FIG. 9 scanning electron microscope (SEM) image of the perpendicular seven-island cluster.

It was observed experimentally whether it is possible to access the lowest energy states in a real system. For this, arrays of 6×6 identical island clusters of Co/Pt multilayer islands were produced with electron beam lithography. The multilayer films of Pt(1.8 nm)/[Co(0.5 nm)/Pt(1.8 nm)]$_6$ were deposited with dc magnetron sputtering. The islands have a diameter d=410 nm and two values of the interisland spacing corresponding to a lattice parameter (see FIG. 9a); p=510 nm (high dipolar coupling) and p=810 nm (low dipolar coupling) were chosen. Neighboring clusters have sufficient separation (>2p) to avoid intercluster dipolar coupling. One demagnetized a sample containing all of the different arrays of clusters by rotating the sample about an in-plane axis (see demagnetization geometry in FIG. 9b) at a frequency of 2 Hz in a magnetic field, starting with a field value of 740 mT, well above the magnetization saturation value and reducing it down to zero at approximately 5 mT/s. Then, the magnetic states were observed with PEEM at the Swiss Light Source (SIM beamline), taking advantage of the x-ray magnetic circular dichroism (XMCD) effect, which with our set-up is sensitive to the out-of-plane magnetization component. XMCD images of part of the array of 7-island clusters for both the small and the large lattice parameters are shown in FIG. 9c and 9d.

The islands have a uniform white (black) contrast corresponding to islands with uniform moments pointing up (down), indicating that the macrospin approximation used for the dipolar energy calculations holds. While most of the three-island subclusters obey the three-island rule, there is a small number of three-island subclusters which do not; 4% at high coupling and 12% at low coupling (25% is expected at zero coupling). The islands do not show a preferred orientation with zero net moment in the sample.

Figure 10:
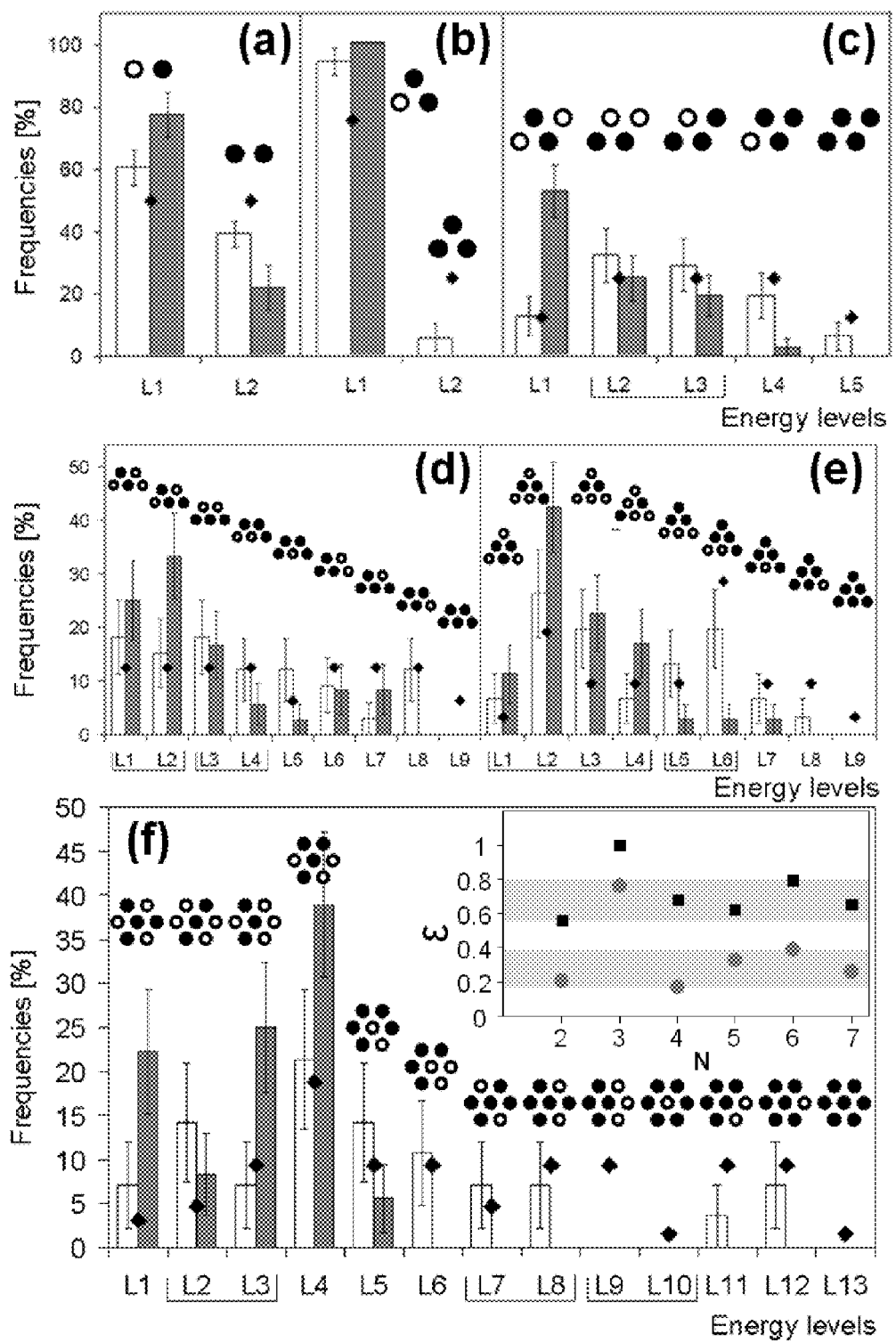
FIG. 10 observed frequency of states for the different perpendicular island clusters.

Further, one determined the frequency of states following demagnetization of the entire set of island cluster arrays (FIG. 10a-f), and compared these values with the random frequencies expected for zero interisland dipolar coupling. The random frequency is simply given by the degree of degeneracy of each state divided by the total number of states. To interpret the data, a demagnetization effectiveness parameter, $\epsilon$, is introduced which is defined as $\epsilon=<E>/E_{GS}$, where $<E>$ is the average dipolar energy per configuration observed on demagnetization and $E_{GS}$ is the ground state energy of the given N-island cluster. When $\epsilon=0$, the distribution of energy states would be purely random (which gives $<E>=0$) and when $\epsilon=1$, all of the clusters in the array would be in the ground state (i.e. $<E>=E_{GS}$). The $\epsilon$ values for all clusters, separated into clusters with high coupling (squares) and low coupling (circles), are plotted in the inset of FIG. 10f.

Excluding for the moment the data for the three-island cluster, all other clusters at low coupling show a frequency distribution close to the random distribution with $\epsilon$ in the range 0.17 to 0.39. This implies that any residual coupling between the dots does not play a significant role in determining the acquired states. This can also be seen in the detailed frequency plots (FIG. 10a, c-f) where the random distribution (rhombuses) is more-or-less mimicked by the measured values (white bars). At high coupling, $\epsilon$ increases to be in the range of 0.56 to 0.79, indicating that the energy distribution moves to lower energies. However, since $\epsilon<1$, there is still evidence of the random distribution. Focusing on the seven island cluster (FIG. 10f), one sees that for high interisland dipolar coupling (grey bars), the levels above L5 are no longer occupied and there is a sharp increase in the number of ground states. For the remaining levels there is still a peak in the frequency values at L4, mirroring the peak in the random distribution but having a higher value due to the occupancy of fewer levels. This general behavior is seen in all of the other clusters (FIG. 10a, c-e) although in the five- and six-island clusters there appears to be a relatively low number of ground states, which is likely to be due to the close proximity of the next highest energy levels.

The effectiveness parameter for the three island cluster is astonishingly high. At low coupling, $\epsilon=0.76$ and at high coupling, all 36 three island clusters fall into the ground state giving $\epsilon=1$. Therefore it seems that the ground states can be captured with an ac magnetic field with a high reliability irrespective of the coupling strengths employed here. This can be partly explained by the fact that in the random limit, it is three times more likely to achieve the ground state with its six-fold degeneracy (L1) than the higher energy state (L2), which has a two-fold degeneracy.

Figure 11:
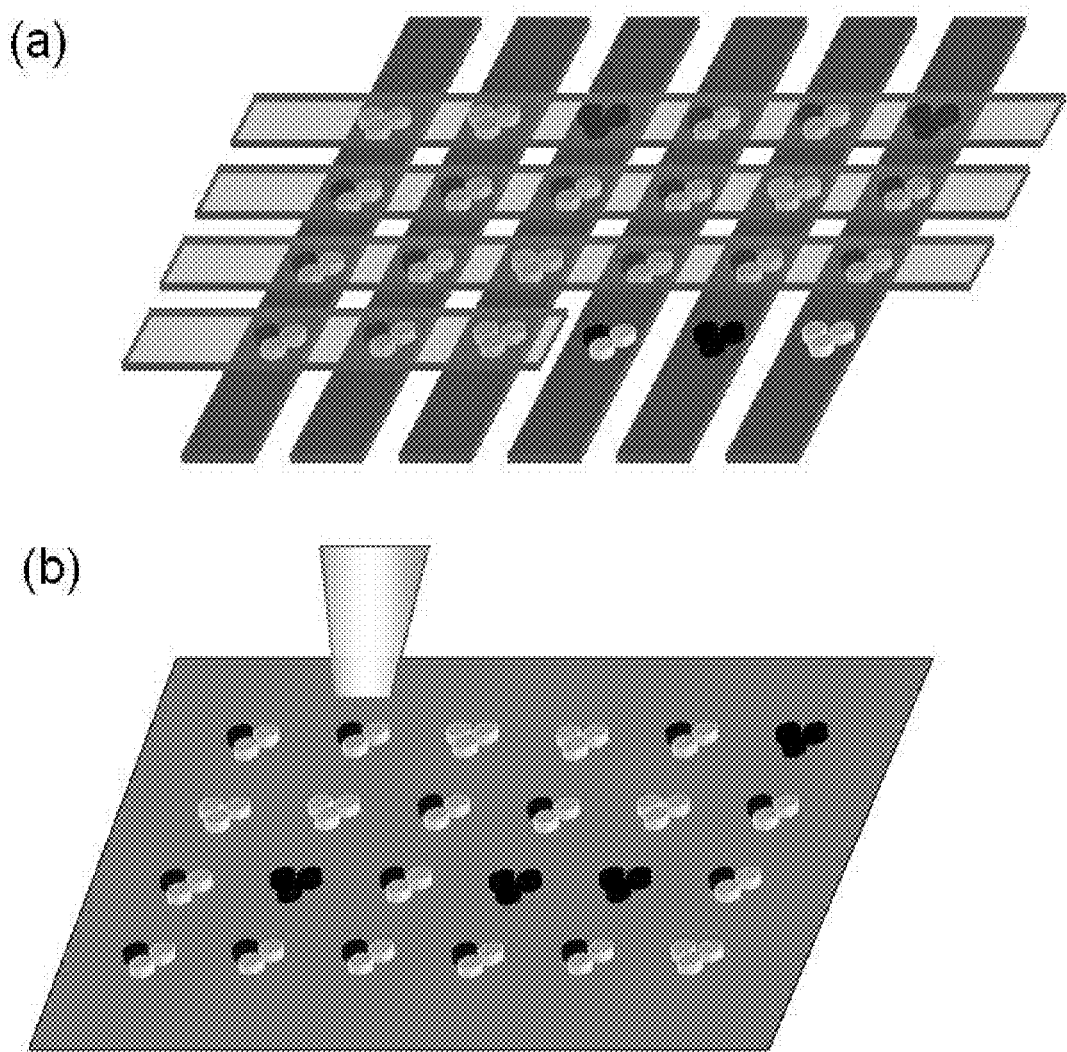
FIG. 11 arrays of perpendicular three-island clusters where coding and read out can be performed with, for example, (a) a recording head and (b) with current lines.

The system, wherein the means for read out comprises an information accessing device, which includes leads such as electrical contacts e.g. in the form of current lines (see FIG. 11a), fiber optic waveguides, contact and non-contact methods using a local probe or recording head (see FIG. 11b), for example either an isolated probe or an array of probes, including optical methods such as focused, near field and uniform illumination.

Further Examples

A key task for every cluster structure is to determine avenues for achieving and measuring specific cluster states reproducibly in the respective real systems.

Summarizing and extrapolating from the experimental results, clusters of ferromagnetic or ferroelectric islands can be arranged in a specific geometry and are close enough to allow magnetic or electric dipolar interactions between the islands. The islands themselves have two (or more) states with magnetization or polarity pointing in one of two (or more) directions. A calculation of the magnetic/electric dipolar energies of the cluster allows the identification of the different states which can be addressed (both read and write) collectively using an applied magnetic, electric or electromagnetic field, or electric current, which can be static or dynamic. The information can be addressed using a recording head, similar to that used for magnetic recording media, or current lines as used in magnetoresistive random access memory devices.

Namely, the arrangement described for ferroelectric islands in a solid matrix with characteristic mechanical properties or a solid matrix layer on a surface exhibiting a mechanical coupling within the clusters which contributes to the overall behavior. Ferroelectric transitions can be excited by pressure/forces applied to the cluster or the individual islands leading to transitions in the state of the single island or cluster. Alternatively, a cluster of deformable objects such as filled vesicles can be taken which are coupled via interlinks made from a different material that acts as springs with tunable spring constants. In this example, the vesicles have two states, either full volume or squashed. The different possible states arise due to the total strain energy of the system depending on the number and position of squashed vesicles. This energy is imparted into the system via heat, light or mechanical pressure and read via optical, electrical or magnetic measurements. The state of the cluster can be assessed either by local probe microscopy or other methods.

Further, one can place clusters of molecules on a surface with either different molecular conformations or electron (charge or spin) states, which interact with each other by linker species which could be molecules or carbon nanotubes or via their indirect coupling through a substrate-molecule interaction. The different states of the cluster are characterized by the conformation or spin state of each molecule and their interaction within the cluster. The information on the state of the cluster could be addressed using individual local probes, light, electromagnetic fields or chemically reactive agents.

Last but not least, one can take a cluster of islands from a material which interacts with electromagnetic radiation (light) and tune their coupling via plasmonic interactions through the supporting surface or matrix. The nonlinearity of the optical properties arising from the coupled cluster islands can be used for local and non local excitation of optical transitions between states.

It has to be emphasized that the overall inventive idea is the same for any possible form of realization since the cluster of coupled island needs to show different energy levels due to the change of its physical and/or chemical property which can be coded as information and being addressed by known means for both excitation of a distinct energy level and read-out of the respective level in order to decode the stored information content by known means.

The invention claimed is:

1. A method for coding and reading out information in a microscopic cluster formed with coupled functional islands, which comprises the following method steps:
   a) generating the cluster by forming a regular microscopic pattern for locating the functional islands;
   b) making use of a physical and/or chemical property of each individual island and making use of the coupling between the functional islands in order to define a plurality of energy levels in each cluster and/or among neighboring clusters;
   c) assigning different information to different energy levels of the cluster; and
   d) effecting a change of the physical and/or chemical property of at least one functional island in order to change the energy level of the cluster to the energy level equivalent to the information content to be coded; and
   e) reading out the information.

2. The method according to claim 1, wherein the physical and/or chemical property, static or dynamic, and the corresponding coupling is at least one selected from a group or groups consisting of:
   magnetic dipole orientation within the islands with a magnetic dipolar coupling between the islands;
   electric dipole orientation within the islands with an electric dipolar coupling between the islands;
   the dimensions, elastic response, hardness, magnetization, electric polarization or optical properties of deformable islands, with e.g an elastic material or springs with tunable spring constants providing a mechanical coupling;
   island (e.g. molecular) orientation with the coupling via physical or chemical interaction through a linker species, substrate or other medium;
   island (e.g. molecular) charge or spin orientation with coupling via exchange interaction, dipolar interaction, spin or charge transfer;
   chemical binding status with coupling via linker molecules, substrate or other medium;
   light absorption, reflection or polarisation characteristics, with a coupling via e.g. plasmonic, photonic e.g. fluorescence resonance energy transfer, or thermal interactions through the supporting surface or matrix;
   electrical, electronic or spintronic properties (e.g. spin, charge, current flow, conductance/resistance, electrical potential/voltage, capacitance, induction, memristance, current/voltage characteristics) in a device (e.g. active, passive, oxide, molecular device) with coupling via electrical or electronic means (e.g. electric fields, electrostatic fields, current through an interconnect, electric charge transfer, orbital or quantum coupling);
   resonant frequency of engineered resonators and oscillators coupled by various means e.g. electromagnetic fields;
   resonant frequency of a microscopic system containing islands (e.g. precessing spins, magnetic moments or vibrating molecules), coupled by various means (e.g. electromagnetic fields).

3. The method according to claim 1, wherein the coupling can be modified by the properties of the medium such as electrical properties (e.g. permittivity), magnetic properties (e.g. permeability), mechanical properties (e.g. stiffness), fluid properties (e.g. viscosity), electronic properties (e.g. conductance) or optical properties (e.g. optical conductance), or thermal properties (e.g. heat conductance).

4. The method according to claim 1, wherein each functional island engages in one of at least two possible states with respect to the physical or chemical property.

5. The method according to claim 1, wherein the cluster has a regular form selected from a triangular form and a rectangular form, or any derivative or combination of the regular forms, and each vertex or interconnect of the respective forms can be represented by a functional island.

6. The method according to claim 5, wherein the different energy levels are determined by the number and/or the location of the different couplings of juxtaposed functional islands, for example for vector properties of the islands such as magnetic dipoles, this would be head-to-tail coupling of juxtaposed functional islands and/or the number and/or the location of the head-to-head or tail-to-tail coupling of juxtaposed functional islands.

7. The method according to claim 5, wherein the change of the energy level is effected by at least one of:
   a) island-related or cluster-related application of magnetic field;
   b) island-related or cluster-related application of electric field;
   c) island-related or cluster-related application of electromagnetic field;
   d) island-related or cluster-related application of electric current;
   e) island-related or cluster-related application of pressure or stress or strain;
   f) island-related or cluster-related application of heat or light; and
   g) island-related or cluster-related application of electromagnetic radiation or chemically reactive agents.

8. A microscopic system for coding and reading out information in a microscopic cluster formed of coupled functional islands, comprising:
   a) at least one cluster being formed as a regular microscopic pattern for locating the functional islands, wherein different information is assigned to different energy levels of at least one cluster and/or neighboring clusters in order to define a plurality of energy levels in each cluster and/or among neighboring clusters;
   b) each individual functional island having a physical and/or chemical property and the functional islands are coupled;
   c) a means for effecting a change of the physical and/or chemical property of at least one functional island in order to change the energy level of the cluster to the energy level equivalent to the information content to be coded;
   d) a means for read out of the information.

9. The system according to claim 8, wherein the physical and/or chemical property, static or dynamical, and the corresponding coupling is at least one selected from a group or groups containing:
   magnetic dipole orientation within the islands with a magnetic dipolar coupling between the islands;
   electric dipole orientation within the islands with an electric dipolar coupling between the islands;
   the dimensions, elastic response, hardness, magnetization, electric polarization or optical properties of deformable islands, with e.g an elastic material or springs with tunable spring constants providing a mechanical coupling;
   island (e.g. molecular) orientation with the coupling via physical or chemical interaction through a linker species, substrate or other medium;
   island (e.g. molecular) charge or spin orientation with coupling via exchange interaction, dipolar interaction, spin or charge transfer;
   chemical binding status with coupling via linker molecules, substrate or other medium;
   light absorption, reflection or polarisation characteristics, with a coupling via e.g. plasmonic, photonic e.g. fluorescence resonance energy transfer, or thermal interactions through the supporting surface or matrix;
   electrical, electronic or spintronic properties (e.g. spin, charge, current flow, conductance/resistance, electrical potential/voltage, capacitance, induction, memristance, current/voltage characteristics) in a device (e.g. active, passive, oxide, molecular device) with coupling via electrical or electronic means (e.g. electric fields, electrostatic fields, current through an interconnect, electric charge transfer, orbital or quantum coupling);
   resonant frequency of engineered resonators and oscillators coupled by various means e.g. electromagnetic fields; and
   resonant frequency of a microscopic system containing islands (e.g. precessing spins, magnetic moments or vibrating molecules), coupled by various means (e.g. electromagnetic fields).

10. The system according to claim 8, wherein each functional island engages in one of at least two possible states with respect to the physical or chemical property.

11. The system according to claim 8, wherein the cluster has a regular form selected from a triangular form and a rectangular form, or any derivative or combination of the regular forms, and each vertex or interconnect of the respective forms can be represented by a functional island.

12. The system according to claim 11, wherein the different energy levels are determined by the number and/or the location of the coupling of juxtaposed functional islands and/or the number and/or the location of the coupling of juxtaposed functional islands, for example for vector properties of the islands such as magnetic dipoles, the head-to-tail coupling of juxtaposed functional islands and/or the number and/or the location of the head-to-head or tail-to-tail coupling of juxtaposed functional islands.

13. The system according to claim 11, wherein the change of the energy level is effected by at least one of:
   a) island-related or cluster-related application of magnetic field;
   b) island-related or cluster-related application of electric field;
   c) island-related or cluster-related application of electromagnetic field;
   d) island-related or cluster-related application of electric current;
   e) island-related or cluster-related application of pressure, stress or strain;
   f) island-related or cluster-related application of heat or light; and
   g) island-related or cluster-related application of electromagnetic radiation or chemically reactive agents.

14. The system according to claim 11, wherein the energy level is detected by at least one of:
   a) island-related or cluster-related measurement with a magnetic field;
   b) island-related or cluster-related measurement with an electric field;
   c) island-related or cluster-related measurement with an electromagnetic field;
   d) island-related or cluster-related measurement with electric current;
   e) island-related or cluster-related measurement of pressure stress, or strain;
   f) island-related or cluster-related measurement of property associated with heat or light; and
   g) island-related or cluster-related measurement of electromagnetic radiation or with chemically reactive agents.

15. The system according to claim 9, wherein the means for reading out comprises an information accessing device, which includes leads such as electrical contacts e.g. in the form of current lines, fiber optic waveguides, contact and non-contact methods using a local probe or recording head, for example either an isolated probe or an array of probes, including optical methods such as focused, near field and uniform illumination.

* * * * *

UNITED STATES PATENT AND TRADEMARK OFFICE
CERTIFICATE OF CORRECTION

| | | |
|---|---|---|
| PATENT NO. | : 8,085,578 B2 | Page 1 of 2 |
| APPLICATION NO. | : 12/487388 | |
| DATED | : December 27, 2011 | |
| INVENTOR(S) | : Laura J. Heyderman et al. | |

It is certified that error appears in the above-identified patent and that said Letters Patent is hereby corrected as shown below:

IN THE SPECIFICATIONS:

Column 3,

Line 67, "For specific geometry" should read -- For a specific geometry --

Column 6,

Line 41, "states sets the groundwork" should read -- states set the groundwork --

Column 8,

Line 65, "structure the percentage" should read -- structures the percentage --

Column 9,

Line 19, "found that the general behavior" should read -- the general behavior --

Column 11,

Line 26, "the ground state of seven-island cluster" should read -- the ground state of the seven-island cluster --

Column 12,

Line 54, "fiber optic wave guides contact" should read -- fiber optic waveguides and contact --

Column 13,

Line 48, "realization since the cluster" should read -- realization where the cluster --

Signed and Sealed this
Fifteenth Day of May, 2012

David J. Kappos
*Director of the United States Patent and Trademark Office*

Column 13,

Line 49, "coupled island needs to show different energy" should read -- coupled island shows different energy --

Line 52, "for both excitation of a distinct energy" should read -- for both excitation to a distinct energy --

IN THE CLAIMS:

Column 16,

Claim 12, Lines 16-24, should read:

-- The system according to claim 11, wherein the different energy levels are determined by the number and/or the location of the coupling of juxtaposed functional islands, for example for vector properties of the islands such as magnetic dipoles, the head-to-tail coupling of juxtaposed functional islands and/or the number and/or the location of the head-to-tail coupling of juxtaposed functional islands. --

Claim 14, Line 53, "cluster-related measurement of property" should read -- cluster related measurement of a property --

Claim 15, Line 60, "fiber optic waveguides, contact and non-contact" should read -- fiber optic waveguides, and contact and non-contact --

UNITED STATES PATENT AND TRADEMARK OFFICE
CERTIFICATE OF CORRECTION

| | | |
|---|---|---|
| PATENT NO. | : 8,085,578 B2 | Page 1 of 1 |
| APPLICATION NO. | : 12/487388 | |
| DATED | : December 27, 2011 | |
| INVENTOR(S) | : Laura J. Heyderman et al. | |

It is certified that error appears in the above-identified patent and that said Letters Patent is hereby corrected as shown below:

In the Claims:

Column 16,

Lines 57-58, "wherein the means for reading out comprises" should read

-- wherein the means for read out comprises --

Signed and Sealed this
Twenty-third Day of April, 2013

Teresa Stanek Rea
*Acting Director of the United States Patent and Trademark Office*